United States Patent [19]

Kasugai

[11] Patent Number: 5,422,577
[45] Date of Patent: Jun. 6, 1995

[54] METHOD AND APPARATUS FOR PRODUCING SLICING PLANES FOR NUCLEAR MAGNETIC RESONANCE IMAGING WITH DESIRED THICKNESS

[75] Inventor: Takao Kasugai, Nishinasunomachi, Japan

[73] Assignee: Kabushiki Kaisha Toshiba, Kawasaki, Japan

[21] Appl. No.: 266,797

[22] Filed: Jun. 28, 1994

Related U.S. Application Data

[63] Continuation of Ser. No. 710,173, Jun. 6, 1991, abandoned.

[30] Foreign Application Priority Data

Jun. 6, 1990 [JP] Japan ................... 2-146236

[51] Int. Cl.$^6$ ........................................ G01R 33/20
[52] U.S. Cl. ........................ 324/309; 324/314
[58] Field of Search ............ 324/307, 309, 306, 300, 324/314; 128/653.2, 653.5

[56] References Cited

U.S. PATENT DOCUMENTS

| | | | |
|---|---|---|---|
| 4,602,641 | 7/1986 | Feinberg | 324/306 |
| 4,665,367 | 5/1987 | Kramer et al. | 324/309 |
| 4,800,494 | 1/1989 | Foxall | 324/309 |
| 5,167,232 | 12/1992 | Parker et al. | 324/306 |

*Primary Examiner*—Sandra L. O'Shea
*Assistant Examiner*—Raymond Y. Mah
*Attorney, Agent, or Firm*—Foley & Lardner

[57] ABSTRACT

A method of producing slicing planes in a nuclear magnetic resonance imaging system capable of obtaining a thin slice thickness easily. RF pulses for sequentially exciting a plurality of excitation planes for determining slicing planes are generated, wherein frequencies of the RF pulses are sequentially controlled such that each two adjacent ones of excitation planes have a mutually overlapping region and two separate non-overlapping regions. Then the generated RF pulses are applied to an object to be examined which has been placed in appropriate static and gradient magnetic fields for obtaining nuclear magnetic resonance signals from the slicing planes defined by the excitation planes in accordance with the mutually overlapping region and the separate non-overlapping regions of each two adjacent ones of the excitation planes. Each RF pulse for exciting one excitation plane may be immediately preceded by a re-excitation RF pulse for re-exciting an immediately preceding excitation plane which serves as a pre-saturation pulse.

19 Claims, 4 Drawing Sheets

ARTIFACT

METHOD AND APPARATUS FOR PRODUCING SLICING PLANES FOR NUCLEAR MAGNETIC RESONANCE IMAGING WITH DESIRED THICKNESS

This application is a continuation of application Ser. No. 07/710,173, filed Jun. 6, 1991, now abandoned.

BACKGROUND OF THE INVENTION

1. Field of the Invention

The present invention relates to a method of adjusting a slice thickness in a nuclear magnetic resonance imaging.

2. Description of the Background Art

In a nuclear magnetic resonance imaging apparatus, it has been considered desirable to make a thickness of a slicing plane as thin as possible, in order to improve the resolution.

Conventionally, the slice thickness has been made thinner by using a greater gradient magnetic field strength, or by using a longer period for applying excitation pulses, or by using a three-dimensional Fourier transform (3DFT) method.

However, in order to provide the greater gradient magnetic field strength, it is necessary to use a gradient magnetic field generation device of a larger capacity. Thus, this is rather expensive manner for obtaining a thin slice thickness.

On the other hand, when the longer period is used for applying excitation pulses, a period for echo generation also becomes longer, and this in turn produces a severe limitation in obtaining T1 (longitudinal relaxation time) emphasized images or T2 (transverse relaxation time) emphasized images.

As for 3DFT, there is a limitation that the signal collection period is longer, so that scanning with a long repetition time is practically impossible, and consequently it is difficult to obtain the T2 emphasized images.

SUMMARY OF THE INVENTION

It is therefore an object of the present invention to provide a method of adjusting a slice thickness in a nuclear magnetic resonance imaging which is capable of obtaining a thin slice thickness easily.

According to one aspect of the present invention there is provided a method of producing slicing planes for a nuclear magnetic resonance imaging, comprising the steps of: generating RF pulses for sequentially exciting a plurality of excitation planes for determining slicing planes, where frequencies of the RF pulses are sequentially controlled such that each two adjacent ones of said excitation planes have a mutually overlapping region and two separate non-overlapping regions; and applying the RF pulses onto an object to be examined placed in appropriate static and gradient magnetic fields for obtaining desired nuclear magnetic resonance signals from the slicing planes according to the mutually overlapping and the separate non-overlapping regions of each two adjacent ones of said excitation planes.

According to another aspect of the present invention there is provided a method of nuclear magnetic resonance imaging, comprising the steps of: placing an object to be examined in appropriate static and gradient magnetic fields; generating RF pulses for sequentially exciting a plurality of excitation planes for determining slicing planes, where frequencies of the RF pulses are sequentially controlled such that each two adjacent ones of excitation planes have a mutually overlapping region and two separate regions which do not overlap; applying the RF pulses onto the object to be examined and obtaining nuclear magnetic resonance signals from the slicing planes determined within the excitation planes according to the mutually overlapping regions; and re-constructing nuclear magnetic resonance images from the nuclear magnetic resonance signals.

Other features and advantages of the present invention will become apparent from the following description taken in conjunction with the accompanying drawings.

DETAILED DESCRIPTION OF THE PREFERRED EMBODIMENTS

Figure 1:
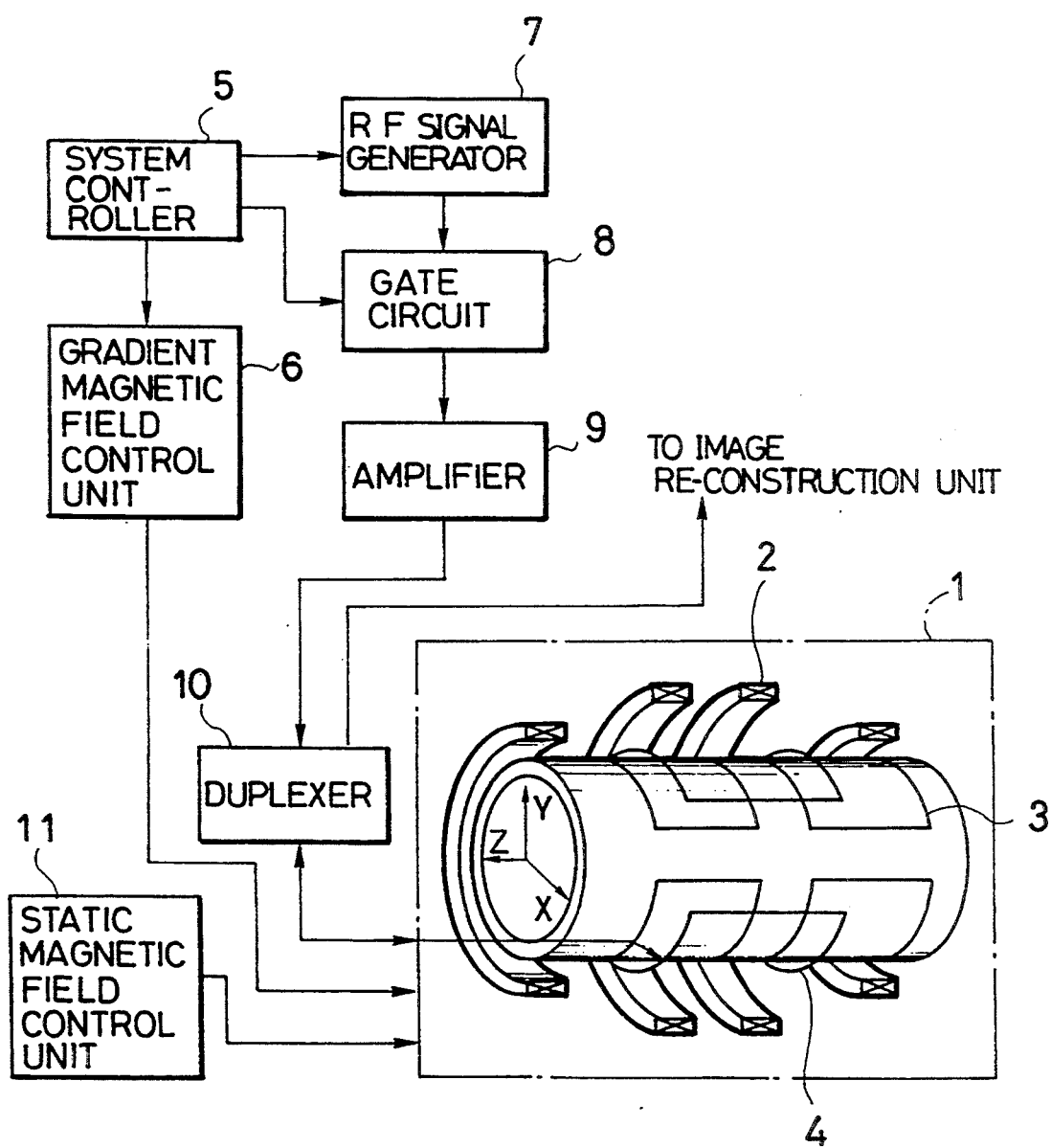
FIG. 1 is a schematic block diagram of a nuclear magnetic resonance imaging apparatus capable of utilizing the method of producing slicing planes according to the present invention.

Referring now to FIG. 1, a configuration of a nuclear magnetic resonance imaging apparatus capable of utilizing the method of producing slicing planes according to the present invention will be described first.

In this nuclear magnetic resonance imaging apparatus of FIG. 1, a magnet assembly 1, in which an object to be examined (not shown) is placed, has a static magnetic field coil 2 for generating a static magnetic field of a constant field strength in a Z direction, gradient magnetic field coils 3 for generating gradient magnetic fields in X, Y, and Z directions, and a transmitter and receiver coil 4 for transmitting RF pulses for exciting the spins of the nuclei in the object to be examined and receiving nuclear magnetic resonance signals from the object to be examined.

A system controller 5 controls an overall operation of the apparatus, and is connected with a gradient magnetic field control unit 6, an RF signal generator 7, and a gate circuit 8.

The gradient magnetic field control unit 6 controls the current supply to the gradient magnetic field coils 3 according to the controlling by the system controller 5.

The RF signal generator 7 generates RF signals corresponding to the RF pulses to be transmitted from the transmitter and receiver coil 4, where the frequency of the RF signals is set to a value appropriate for the corresponding RF pulses to excite a desired slicing plane specified by the system controller 5. The excitation planes are plane regions excited by the RF pulses, while the slicing planes are plane regions from which the nuclear magnetic resonance signals to be used for the image reconstruction are collected.

The gate circuit 8 modulates the RF signals generated by the RF signal generator 7 at a timing given by a timing signal from the system controller 5, so as to obtain the RF pulses corresponding to the RF signals generated by the RF signal generator 7.

The RF pulses obtained by the gate circuit 8 are then amplified at an amplifier 9, and supplied to the transmitter and receiver coil 4 through a duplexer 10. On the other hand, the nuclear magnetic resonance signals collected by the transmitter and receiver coil 4 are supplied to an image reconstruction unit (not shown) through the duplexer 10.

In addition, there is provided a static magnetic field control unit 11 for controlling the current supply to the static magnetic field coil 2, so as to control the field strength of the static magnetic field generated by the static magnetic field coil 2.

In this apparatus of FIG. 1, the frequency and timing for application of the RF pulses are sequentially controlled by the system controller 5 through the RF signal generator 7 and the gate circuit 8 in order to set up the desired slicing planes at the desired timing according to the present invention as will now be described in detail. The gradient magnetic fields for slicing, reading and phase encoding, produced by the gradient magnetic field coils 3 and the gradient magnetic field control unit 6, can be substantially similar to those used in a conventional nuclear magnetic resonance imaging apparatus, so their detailed description will be omitted.

Figure 2:
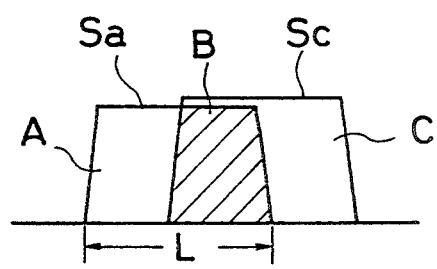
FIG. 2 is a diagram of two adjacent slices obtained by the method of producing slicing planes according to the present invention, for explaining a mechanism of this method.

According to the present invention, the RF pulses are sequentially controlled such that two adjacent excitation planes for determining the slicing planes have a mutually overlapping region and two separate non-overlapping regions as shown in FIG. 2, where two adjacent excitation planes Sa and Sc, with a right half of the excitation plane Sa overlapping with a left half of the excitation plane Sc, are set up to produce a plane region A due to the excitation plane Sa alone, a plane region B due the mutually overlapping region of the excitation planes Sa and Sc, and a plane region C due to the excitation plane Sc alone.

Now, let each of the excitation planes Sa and Sc be having a thickness of L, and consider a case of applying an RF pulse sequence such that the excitation planes Sa and Sc are excited alternatively in a time sequence, i.e., in a sequence such as Sa, Sc, Sa, In this case, the strength of the nuclear magnetic resonance signals from the plane region A is determined by the repetition time between the excitation of the excitation plane Sa and the next excitation of the same excitation plane Sa, while the strength of the nuclear magnetic resonance signals from the slicing plane B is determined by the repetition time between the excitation of the excitation plane Sa and the immediately following excitation of the excitation plane Sc. Similarly, the strength of the nuclear magnetic resonance signals from the plane region C is determined by the repetition time between the excitation of the excitation plane Sc and the next excitation of the same excitation plane Sc, while the strength of the next nuclear magnetic resonance signals from the plane region B is determined by the repetition time between the excitation of the excitation plane Sc and the immediately following excitation of the excitation plane Sa, which is the same as the repetition time between the excitation of the excitation plane Sc and the immediately following excitation of the excitation plane Sc discussed above.

Thus, when the RF pulse application interval is maintained constant in such an RF pulse sequence, the repetition time for excitations in the plane regions A and C becomes twice as long as the repetition time for the plane region B. As a result, the strength of the nuclear magnetic resonance signals from the plane regions A and C are twice as strong as the strength of the nuclear magnetic resonance signals from the plane region B. Thus, in this case, by regarding the nuclear magnetic resonance signals from the plane region B as negligibly weak compared with those from the plane regions A and C, the plane regions A and C can be taken as the slicing planes with thicknesses equal to L/2.

Figure 3:
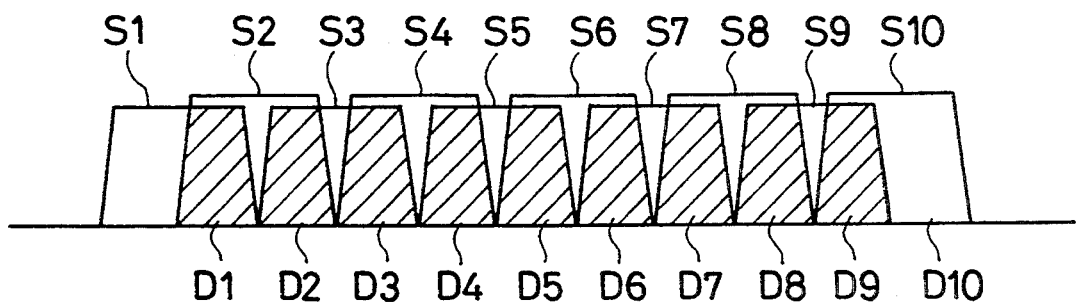
FIG. 3 is a diagram of a plurality of slices obtained by applying the method explained by Fig, 2 to a case of a multi-slice imaging.

The arrangement of the adjacent excitation planes as described above for FIG. 2 can be applied to a case of a multi-slice imaging as shown in FIG. 3, which shows an exemplary case of producing 10 slicing planes S1 to S10. Here, the slicing planes S1 to S10 can be set up sequentially by controlling the frequency of the RF pulses appropriately at a constant time interval by the system controller 5. In this example of FIG. 3, the RF pulse sequence is controlled such that two adjacent excitation planes have a mutually overlapping region with a thickness equal to a half of the slice thickness of each excitation plane and two separate non-overlapping regions, each with a thickness equal to half of the thickness of each excitation plane.

Figure 4:
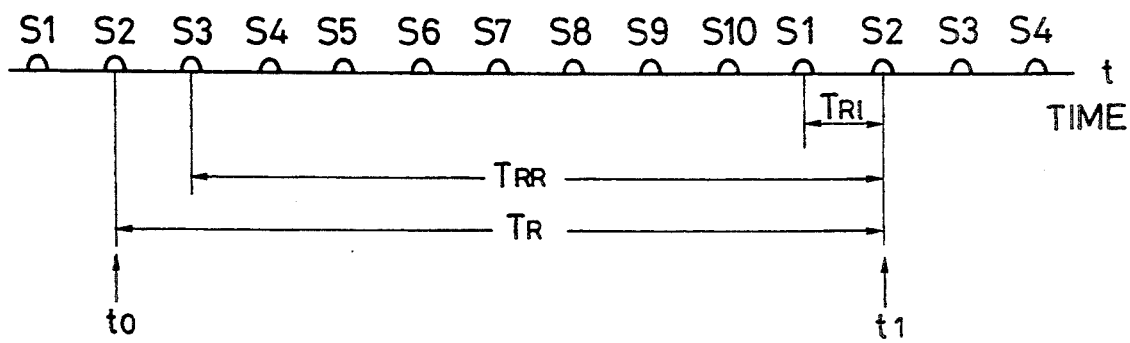
FIG. 4 is a timing chart for an RF pulse sequence to obtain the slices of FIG. 3.

Such an RF pulse sequence can be realized by the sequence according to the timing chart of FIG. 4, in which the excitation pulses for the excitation planes S1 to S10 are sequentially applied at a constant time interval.

Here, if there is no overlapping region between the adjacent excitation planes, repetition time for the excitations in the plane formed by the excitation plane S2 would be $T_R$ between a time $t_0$ of the first excitation to a time $t_1$ of the next excitation. However, because left half of the excitation plane S2 is actually overlapping with the right half of the excitation plane S1 in this example, the repetition time for excitations in the slicing plane D1 determined by this overlapping region is $T_{RL}$ between the excitation of the excitation plane S1 and the immediately following excitation of the excitation plane S2. On the other hand, the right half of the excitation plane S2 is overlapping with the left half of the excitation plane S3, so that the repetition time for excitations in the slicing plane D2 determined by this overlapping region is $T_{RR}$ between the previous excitation of the excitation plane S3 and the next excitation of the excitation plane S2.

As a result, when the excitation plane S2 is excited the repetition time for excitations in the slicing plane D2 due to the right half of this excitation plane S2 is nine times as long as the repetition time for excitations in the slicing plane D1 due to the left half of this same excitation plane S2. Consequently, the strength of the nuclear magnetic resonance signals from the slicing plane D2 is nine times as strong as the strength of the nuclear magnetic resonance signals from the slicing plane D1, so that effectively the nuclear magnetic resonance signals from the slicing plane D1 are negligibly weak compared with the nuclear magnetic resonance signals from the slicing plane D2.

Thus, when the excitation plane S2 is excited, only the nuclear magnetic resonance signals from the slicing plane D2 are effectively obtained, such that the slice thickness as thin as a half of that due to a single excitation plane can be realized in effect. The other slicing planes D1 to D9 can be obtained analogously.

Figure 5:
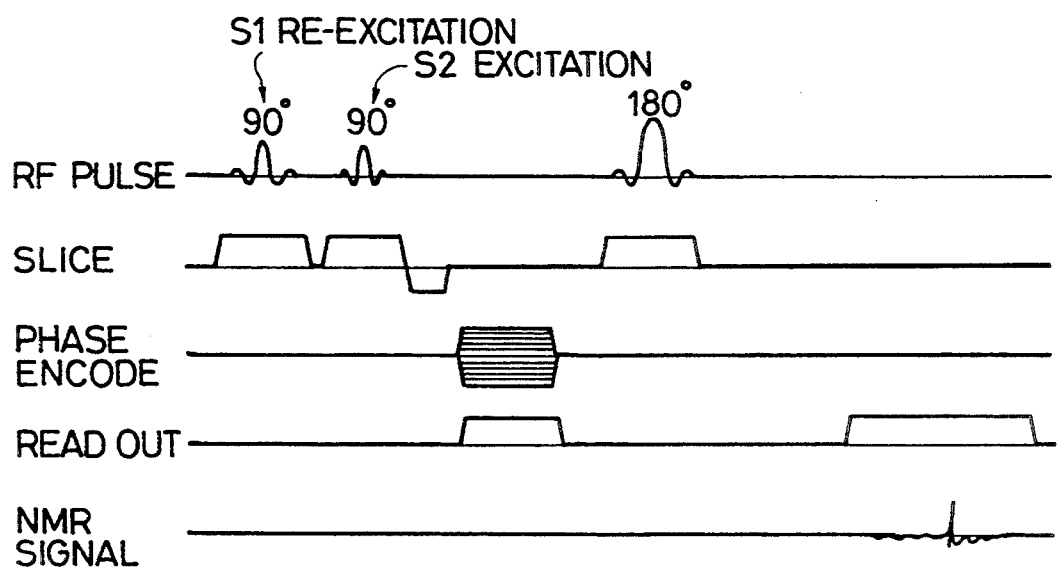
FIG. 5 is a timing chart for RF pulses, gradient magnetic fields, and nuclear magnetic resonance signals in one variation of the method of producing slicing planes according to the present invention.

In the above example of FIGS. 3 and 4, if the nuclear magnetic resonance signals from the plane region associated with the repetition time $T_{RL}$ is not quite negligible, or if it is desired to improve the image quality, these nuclear magnetic resonance signals from the slicing plane region associated with the repetition time $T_{RL}$ can be completely eliminated by using the RF pulse sequence as shown in FIG. 5, where FIG. 5 indicates the RF pulse sequence along with the sequences for the slicing, phase encoding, and reading gradient magnetic fields, and the resulting NMR signals.

In this RF pulse sequence of FIG. 5, the excitation plane S1 is re-excited immediately before the excitation of the excitation plane S2 such that the slicing plane D1 is pre-saturated at a time of the excitation of the excitation plane S2.

Figure 6:
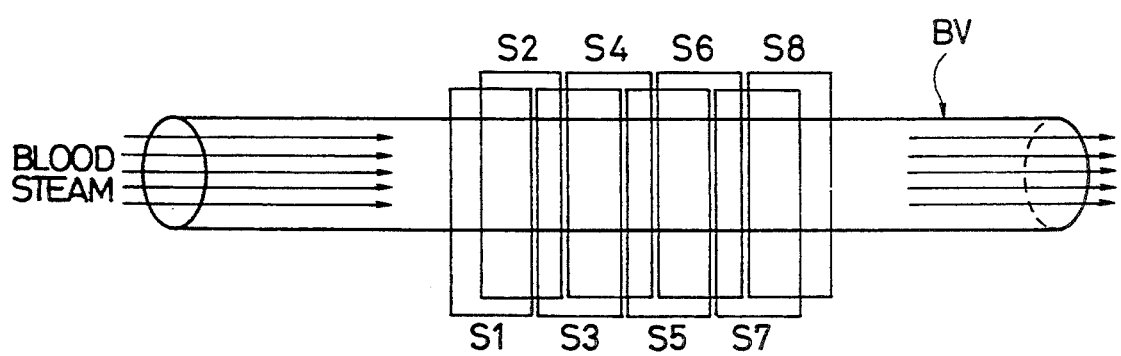
FIG. 6 is an illustration of a setting of slices over a blood vessel suitable for the method of producing slicing planes using the timing chart of FIG. 5.
Figure 7A:
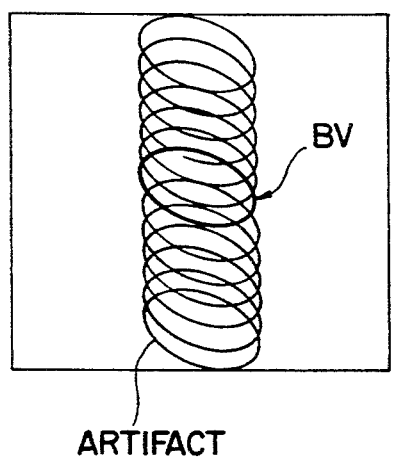
FIG. 7(A) is an illustration of a nuclear magnetic resonance image of the blood vessel of FIG. 6, which has an artefact.
Figure 7B:
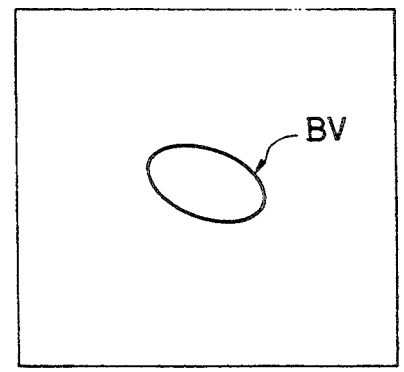
FIG. 7(B) is an illustration of a nuclear magnetic resonance image of the blood vessel of FIG. 6, which has no artefact.

This RF pulse sequence of FIG. 5 is particularly effective for imaging a moving object to be examined, such as a blood stream flowing through a blood vessel. Namely, in a case of imaging a blood stream flowing through a blood vessel BV as shown in FIG. 6, an artifact such as that shown in FIG. 7(A) appears in the reconstructed image unless a region located upstream of the region of interest is pre-saturated. However, a conventional method using pre-saturation pulses has a drawback that the number of slices is reduced to about one third of those produced without the pre-saturation pulses. In contrast, in the RF pulse sequence of FIG. 5, the pre-saturation pulse is already provided by the re-excitation pulse for the excitation plane S1, so that there is no need for additional presaturation pulses, and therefore the image can be obtained, without an artifact as shown in FIG. 7(B), by using the RF pulse sequence of FIG. 5 without reducing the number of slices.

It is to be noted that the method of adjusting a slice thickness according to the present invention as described above can be modified such that the size of the various different slice thickness can be realized by changing the overlapping regions between the adjacent excitation planes.

It is also to be noted that the present invention is equally applicable to the nuclear magnetic resonance imaging method other than that used in the above description, such as a nuclear magnetic resonance spectroscopy.

Many other modifications and variations of the above embodiments may be made without departing from the novel and advantageous features of the present invention. Accordingly, all such modifications and variations are intended to be included within the scope of the appended claims.

What is claimed is:

1. A method of producing slicing planes for nuclear magnetic resonance imaging, comprising the steps of:
generating RF pulses for sequentially exciting a plurality of excitation planes for determining slicing planes, where frequencies of said RF pulses are sequentially controlled such that each two adjacent ones of said excitation planes have a mutually overlapping partial region; and
applying said RF pulses onto an object to be examined which has been placed in appropriate static and gradient magnetic fields for obtaining desired nuclear magnetic resonance signals from each one of said slicing planes defined only by a part of each excitation plane other than said mutually overlapping partial region between said each excitation plane and an immediately preceding excitation plane.

2. The method of claim 1, wherein at said applying step said RF pulses are applied with a constant time interval between two successive RF pulses.

3. The method of claim 1, wherein said mutually overlapping region has a thickness equal to a half of a thickness of each excitation plane.

4. The method of claim 1, wherein said RF pulses are applied such that a repetition time for excitations in said mutually overlapping partial region between said each excitation plane and said immediately preceding excitation plane is substantially shorter than a repetition time for excitations in said part of each excitation plane other than said mutually overlapping partial region between said each excitation plane and said immediately preceding excitation plane.

5. The method of claim 1, wherein said RF pulses are applied such that a repetition time for excitations in said mutually overlapping partial region between said each excitation plane and said immediately preceding excitation plane is substantially shorter than a repetition time for excitations in said mutually overlapping partial region between said each excitation plane and an immediately following excitation plane.

6. The method of claim 1, wherein each RF pulse for exciting one excitation plane is immediately preceded by a re-excitation RF pulse for re-exciting an Immediately preceding excitation plane of said one excitation plane.

7. The method of claim 6, wherein said re-excitation RF pulse is sufficient to pre-saturate said immediately preceding excitation plane.

8. The method of claim 7, wherein said object to be examined is in motion an artifact due to the motion is suppressed by a pre-saturation of said immediately preceding excitation plane by said re-excitation RF pulse.

9. A method of nuclear magnetic resonance imaging, comprising the steps of:
placing an object to be examined in appropriate static and gradient magnetic fields;
generating RF pulses for sequentially exciting a plurality of excitation planes for determining slicing planes, where frequencies of the RF pulses are sequentially controlled such that each two adjacent ones of said excitation planes have a mutually overlapping partial region;
applying said RF pulses onto said object to be examined and obtaining nuclear magnetic resonance signals from each one of said slicing planes defined only by a part of each excitation plane other than said mutually overlapping partial region between said each excitation plane and an immediately preceding excitation plane; and
re-constructing nuclear magnetic resonance images from said nuclear magnetic resonance signals.

10. The method of claim 9, wherein said applying step further comprises applying said RF pulses with a constant time interval between two successive RF pulses.

11. The method of claim 9, wherein said mutually partial region has a thickness equal to a half of a slice thickness of each excitation plane.

12. The method of claim 9, wherein said RF pulses are applied such that a repetition time for excitations in said mutually overlapping partial region between said each excitation plane and said immediately preceding excitation plane is substantially shorter than a repetition time for excitations in said part of each excitation plane other than said mutually overlapping partial region between said each excitation plane and said immediately preceding excitation plane.

13. The method of claim 9, wherein said RF pulses are applied such that a repetition time for excitations in said mutually overlapping partial region between said each excitation plane and said immediately preceding excitation plane is substantially shorter than a repetition time for excitations in said mutually overlapping partial region between said each excitation plane and an immediately following excitation plane.

14. The method of claim 9, wherein each RF pulse for exciting one excitation plane is immediately preceded by a re-excitation RF pulse for re-exciting an immediately preceding excitation plane of said one excitation plane.

15. The method of claim 14, wherein said re-excitation RF pulse is sufficient to pre-saturate said immediately preceding excitation plane.

16. The method of claim 15, wherein said object to be examined is in motion such that an artifact due to the motion is suppressed by a pre-saturation of said immediately preceding excitation plane by said re-excitation RF pulse.

17. An apparatus for producing slicing planes for nuclear magnetic resonance imaging, comprising:
an RF pulse generator outputting RF pulses; means for sequentially controlling frequencies of said RF pulses such that each two adjacent ones of excitation planes excited by said RF pulses have a mutually overlapping partial region; and
a magnet assembly including:
a static magnetic field generator, and
a gradient magnetic field generator; wherein
an object to be examined is placed in said magnet assembly, said RF pulses are applied to said object, and magnetic resonance signals are generated from each one of said slicing planes defined only by a part of each excitation plane other than said mutually overlapping partial region between said each excitation plane and an immediately preceding excitation plane.

18. The apparatus as recited in claim 17, wherein said mutually partial region has a thickness equal to half of the thickness of each excitation plane.

19. The apparatus as recited in claim 17, wherein said RF pulses are applied with a constant time interval between successive RF pulses.

* * * * *